United States Patent
Fukuda et al.

(10) Patent No.: US 7,741,654 B2
(45) Date of Patent: Jun. 22, 2010

(54) GROUP III NITRIDE SEMICONDUCTOR OPTICAL DEVICE

(75) Inventors: Kazuhisa Fukuda, Minato-ku (JP); Chiaki Sasaoka, Minato-ku (JP); Akitaka Kimura, Minato-ku (JP)

(73) Assignee: NEC Corporation, Tokyo (JP)

( * ) Notice: Subject to any disclaimer, the term of this patent is extended or adjusted under 35 U.S.C. 154(b) by 204 days.

(21) Appl. No.: 11/575,387

(22) PCT Filed: Sep. 15, 2005

(86) PCT No.: PCT/JP2005/017007
§ 371 (c)(1),
(2), (4) Date: Mar. 15, 2007

(87) PCT Pub. No.: WO2006/030845
PCT Pub. Date: Mar. 23, 2006

(65) Prior Publication Data
US 2008/0063020 A1    Mar. 13, 2008

(30) Foreign Application Priority Data
Sep. 16, 2004    (JP) .............................. 2004-270397

(51) Int. Cl.
*H01L 29/12* (2006.01)
*H01L 31/00* (2006.01)
*H01L 33/00* (2006.01)

(52) U.S. Cl. ........................... 257/103; 257/11; 257/12; 257/13; 257/14; 257/15; 257/21; 257/22; 257/189; 257/E33.026; 257/E33.03; 257/E33.031; 257/E33.033

(58) Field of Classification Search ............ 257/11–15, 257/21–22, 103, 189, E33.026, E33.03, E33.031, 257/E33.033; 977/761, 825, 932
See application file for complete search history.

(56) References Cited

U.S. PATENT DOCUMENTS

| | | | | | |
|---|---|---|---|---|---|
| 4,922,499 | A | * | 5/1990 | Nitta et al. | 372/46.01 |
| 5,585,649 | A | * | 12/1996 | Ishikawa et al. | 257/94 |
| 5,754,714 | A | * | 5/1998 | Suzuki et al. | 385/5 |
| 5,764,673 | A | * | 6/1998 | Kawazu et al. | 372/45.01 |
| 5,821,555 | A | * | 10/1998 | Saito et al. | 257/13 |
| 5,838,028 | A | * | 11/1998 | Horie et al. | 257/183 |
| 5,974,069 | A | * | 10/1999 | Tanaka et al. | 372/46.01 |
| 5,987,048 | A | * | 11/1999 | Ishikawa et al. | 372/46.01 |
| 6,064,079 | A | * | 5/2000 | Yamamoto et al. | 257/101 |
| 6,080,599 | A | * | 6/2000 | Yamamoto et al. | 438/33 |

(Continued)

FOREIGN PATENT DOCUMENTS

JP    10-093192 A    4/1998

(Continued)

*Primary Examiner*—Ida M Soward
(74) *Attorney, Agent, or Firm*—Sughrue Mion, PLLC (57) ABSTRACT

The present invention provides a semiconductor laser excellent in the current injection efficiency. In an inner stripe type semiconductor laser according to the present invention, a p type cladding layer 309 has a superlattice structure composed of GaN layers and $Al_{0.1}Ga_{0.9}N$ layers, which are alternately layered on each other. The p type cladding layer 309 has a portion of high dislocation density and a portion of low dislocation density. That is, the dislocation density is relatively low in a region directly above an opening of the current-confining region 308, whereas the dislocation density is relatively high in a region directly above a current-confining region 308.

7 Claims, 5 Drawing Sheets

U.S. PATENT DOCUMENTS

| | | | |
|---|---|---|---|
| 6,298,079 B1 * | 10/2001 | Tanaka et al. | 372/46.01 |
| 6,452,954 B2 * | 9/2002 | Fukunaga | 372/46.01 |
| 6,580,736 B1 * | 6/2003 | Yoshie et al. | 372/45.01 |
| 6,590,919 B1 * | 7/2003 | Ueta | 372/46.01 |
| 6,621,106 B2 * | 9/2003 | Murakami et al. | 257/97 |
| 6,741,623 B2 * | 5/2004 | Ishikawa et al. | 372/45.01 |
| 6,756,245 B2 * | 6/2004 | Ohbo et al. | 438/46 |
| 6,770,915 B2 * | 8/2004 | Murakami et al. | 257/98 |
| 6,795,471 B2 * | 9/2004 | Watanabe et al. | 372/46.01 |
| 6,835,963 B2 * | 12/2004 | Hatakoshi et al. | 257/98 |
| 6,858,877 B2 * | 2/2005 | Kawaguchi et al. | 257/97 |
| 6,904,071 B1 * | 6/2005 | Goto et al. | 372/43.01 |
| 6,943,377 B2 * | 9/2005 | Gaska et al. | 257/79 |
| 6,996,150 B1 * | 2/2006 | Shakuda | 372/46.01 |
| 7,102,174 B2 * | 9/2006 | Hideyoshi et al. | 257/94 |
| 7,132,677 B2 * | 11/2006 | Kim et al. | 257/14 |
| 7,244,964 B2 * | 7/2007 | Hata | 257/87 |
| 7,396,697 B2 * | 7/2008 | Hasegawa et al. | 438/40 |
| 2001/0011730 A1 * | 8/2001 | Saeki | 257/79 |
| 2001/0016404 A1 * | 8/2001 | Hayakawa | 438/496 |
| 2003/0197166 A1 * | 10/2003 | Ishida et al. | 257/1 |
| 2004/0185589 A1 * | 9/2004 | Ishikawa et al. | 438/47 |
| 2004/0228381 A1 * | 11/2004 | Jikutani et al. | 372/46 |
| 2006/0011946 A1 * | 1/2006 | Toda et al. | 257/202 |

FOREIGN PATENT DOCUMENTS

| | | |
|---|---|---|
| JP | 2000-031591 A | 1/2000 |
| JP | 2001-015860 A | 1/2001 |
| JP | 2001-223440 A | 8/2001 |
| JP | 2002-171028 A | 6/2002 |
| JP | 2002-540618 A | 11/2002 |
| JP | 2002-078215 A | 3/2003 |
| JP | 2003-078215 A | 3/2003 |
| JP | 2003-086841 A | 3/2003 |
| WO | WO 00/58999 A2 | 10/2000 |

* cited by examiner

GROUP III NITRIDE SEMICONDUCTOR OPTICAL DEVICE

TECHNICAL FIELD

The present invention relates to a Group III nitride semiconductor optical device.

BACKGROUND ART

Group III nitride semiconductors that are represented by gallium nitride have been attracting attention as materials for light-emitting diodes (LEDs) and laser diodes (LDs) because blue-violet light emission with a high efficiency is obtained therewith. Among others, LDs are expected as light sources fit for large-capacity optical disk apparatus and recent years have seen aggressive development of high-output LDs as light sources for writing thereof.

Figure 1:
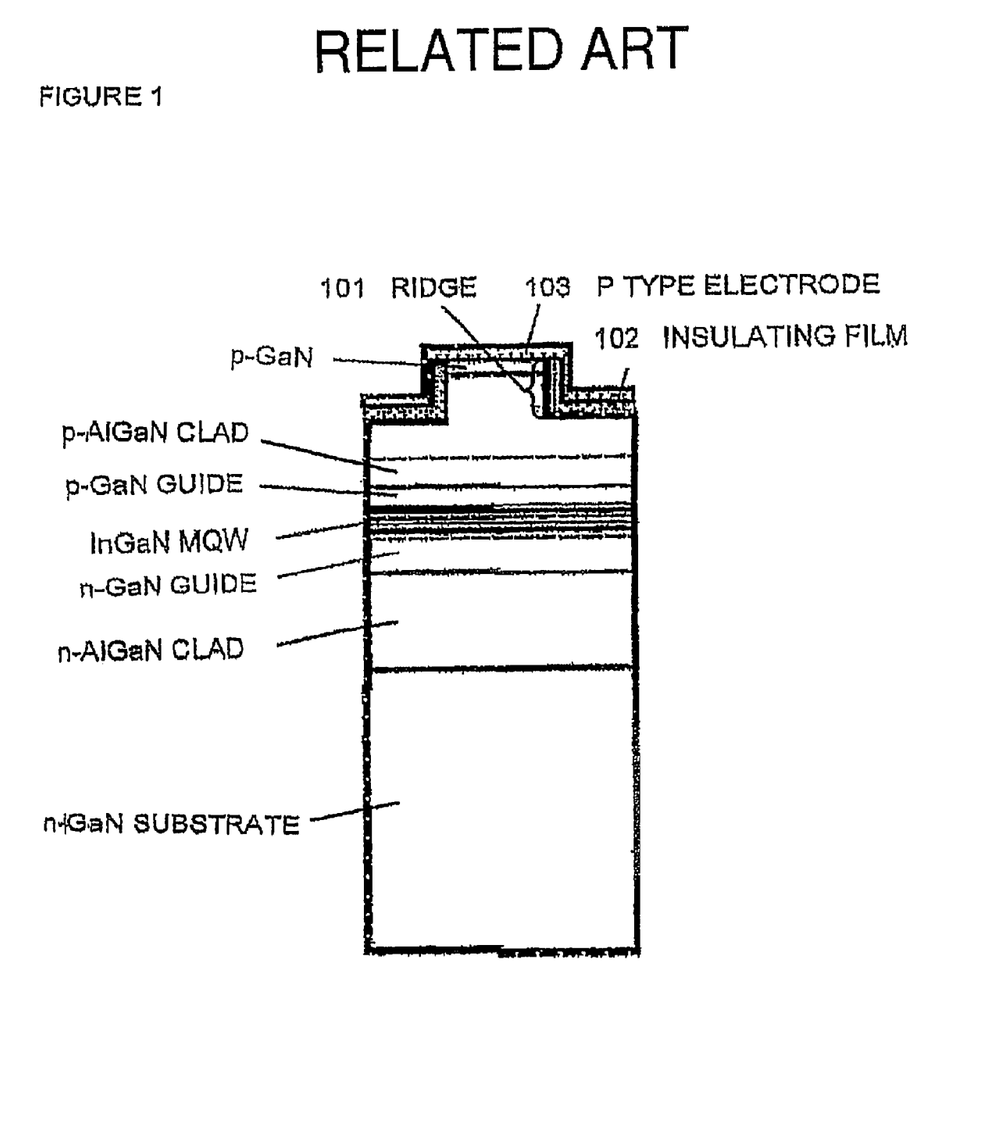
FIG. 1 is a sectional view that schematically shows the construction of a conventional semiconductor laser having a ridge type waveguide structure.

A typical structure for a nitride-based blue-violet LD is illustrated in FIG. 1. In this structure, a ridge 101 is formed by dry etching. The upper part of the ridge is covered with an insulating film 102 having a stripe-shaped opening and a p type electrode 103 is provided in the opening. Current confinement is attained by using the stripe-shaped electrode, and the control of the transverse mode is achieved by adjusting ridge width and ridge height thereof.

However, such a ridge type semiconductor laser has had problems as described below. In applications to optical disks, in order to efficiently focus laser beams in spot form, it is necessary to adjust the pattern of the beams, and thus it is necessary to control the transverse mode thereof so that a far-field pattern of laser beams has a Gaussian type intensity profile. For this purpose, in a high-output blue LD, it is necessary to narrow the ridge width to such a narrow size as 1.7 µm. However, as the ridge width is narrowed, the area of the electrode provided thereon is narrowed, resulting in the increase of the contact resistance. In a high-output LD, because of a high operating current density, there are some cases where the deterioration of the device may be induced by a heat generated at the contact.

Figure 2:
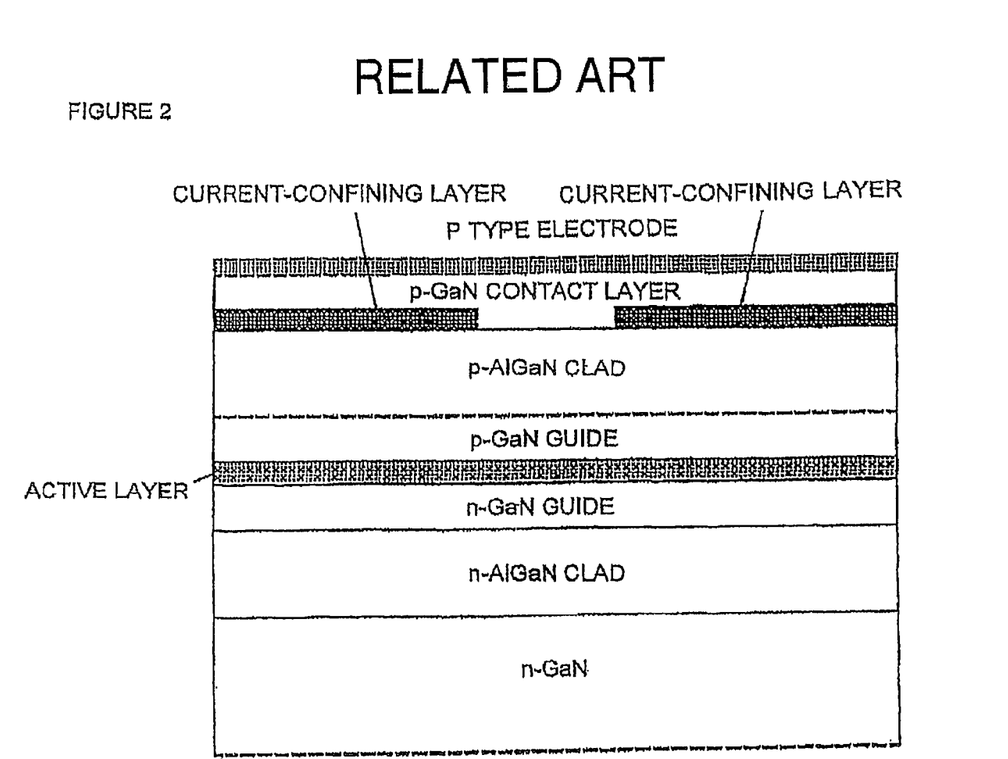
FIG. 2 is a sectional view that schematically shows the construction of a conventional inner stripe type semiconductor laser.

In view of such a problem, inner stripe type LDs in which AlN and (Al)GaN are employed to form the current-confining layer as shown in FIG. 2 have been proposed (JP 2001-15860 A1, JP 10-093192 A1, and JP 2003-78215 A1). Because a wide contact area can be employed in these inner stripe type LDs, a low contact resistance can be realized even in a high-output LD with a narrow stripe width. In particular, the inner stripe structure in which low-temperature grown AlN is used to form the current-confining layer (JP 2001-15860 A1) has the advantage that it is less influenced by damage during the formation of the opening of the current-confining layer and contamination with impurities, and hence it is laid a great hope to as a high-output LD capable of operating with a low-voltage.

On the other hand, there have been also examined such a trial that a superlattice structure is used to form a cladding layer in the upper part of an active layer (JP 2002-171028 A1). Because a carrier is induced to the interface of each layer composing the superlattice structure, the resistance in the thickness-direction of the layers decreases, and the carrier mobility in the in-plane direction of the layers increases. As a result of this, it becomes possible to efficiently utilize the carrier in the operation of the element and to substantially reduce the operating voltage.

DISCLOSURE OF THE INVENTION

Problem to be Solved by the Invention

By combining a cladding layer of a superlattice structure as described above and a current-confining layer, it is expected that a semiconductor device having a high current injection efficiency and a low operating voltage is realized.

However, when a structure in which a cladding layer of a superlattice structure and a current-confining layer are combined was actually fabricated, of course the current injection efficiency could be improved, but it was not always easy to stably obtain a high current injection efficiency. In particular, there was observed the phenomenon that the current injection efficiency of an obtained device and the like vary by reflecting deviations of film deposition condition for the superlattice cladding layer.

In an inner stripe type LD in which AlGaN or AlN is used for the current-confining layer, there were some cases that the device was split away in the steps of isolation, wire bonding, soldering onto a heat sink, etc. and there was room for improvement in this respect.

For the phenomenon that a device is split in the steps of wire bonding, soldering onto a heat sink, etc., it might be considered that it is caused by the generation of strains or stresses due to a difference in lattice constant at an interface between a current-confining layer and a semiconductor layer lying around the layer.

On the other hand, when a material having a lattice constant greatly different from that for a surrounding semiconductor layer is used for the current-confining layer, it was found that under some manufacturing conditions, there are some cases that many dislocations are introduced into a cladding layer, which is an layer lying thereon. In order to stably improve the current injection efficiency, it becomes also important to reduce such dislocations introduced in the cladding layer.

Means for Solving Problem

The present invention has been made in view of the above-described circumstances and concretely the invention has the following constitution.

The semiconductor laser according to the first embodiment of the present invention is a Group III nitride semiconductor laser device comprising
an active layer made of a Group III nitride semiconductor,
a current-confining layer provided over the active layer,
an opening for current injection provided as a current injection region in the current-confining layer,
a cladding layer of a superlattice structure provided on an upper part of the current-confining layer and the opening for current injection,
a contact layer provided on an upper part of the cladding layer, and
an electrode provided on a surface of the contact layer,
wherein the dislocation density of the cladding layer in a region directly above the current-confining layer is higher than the dislocation density of the cladding layer in a region directly above the opening for current injection.

A cladding layer of a superlattice structure is employed in the semiconductor optical device of the present invention. Because a carrier is induced to the interface of each of layers composing the superlattice structure, the resistance in the layer thickness direction is reduced and the carrier mobility in the in-plane direction of the layer increases. As a result of this, it becomes possible to efficiently utilize the carrier in the operation of the device and to substantially reduce the operating voltage.

However, when such a superlattice structure is employed therein, the carrier mobility in the in-plane direction of the layer increases as described above and, therefore, there are some cases that a carrier injected from the electrode may be spread out in the in-plane direction of the layer, resulting in decrease of the current injection efficiency.

Therefore, in the first embodiment of the present invention, the leakage of a carrier in the in-plane direction of the layer is suppressed by giving different distribution to the dislocation density of the cladding layer in a region directly above the current-confining layer and in a region directly above the opening for current injection (the current injection region). That is, in the current-confining region disposed around the current injection region, by providing the increased dislocation density of the cladding layer, the carrier mobility therein is reduced to prevent the leakage of the carrier into this region. As a result of this, the current injection efficiency is improved as to promote, for example, a decrease in threshold current in the semiconductor laser.

The semiconductor laser according to the second embodiment of the present invention is a Group III nitride semiconductor laser device comprising an active layer made of a Group III nitride semiconductor, a current-confining layer provided over the active layer, an opening for current injection provided as a current injection region in the current-confining layer, a cladding layer of a superlattice structure provided on an upper part of the current-confining layer and the opening for current injection, a contact layer provided on an upper part of the cladding layer, and an electrode provided on a surface of the contact layer, wherein the current-confining layer is made of $Al_xGa_yIn_{1-x-y}N$ ($0.4 \leq x \leq 1$, $0 \leq y \leq 0.6$, $0 \leq x+y \leq 1$)

Although the current confining effect is increased when a current-confining layer of such a high-aluminum composition is used, the quality of a film provided over the current-confining layer tends to decrease. This is because increase in internal strains due to a difference in lattice constant is caused by a large difference in composition between the current-confining layer and the film provided thereon. Although good quality can be obtained by appropriately combining film deposition conditions thereof, quality may sometimes vary depending on accidental deviation from the film deposition conditions and there was room for improvement in this respect.

Therefore, in the second embodiment of the present invention, the aforementioned problem is solved by combining a current-confining layer of a high-aluminum composition with a cladding layer of a superlattice structure. A good current confining effect is obtained by using a current-confining layer of a high-aluminum composition. On the other hand, a cladding layer of a superlattice structure is employed to promote a reduction of dislocations therein. When a current-confining layer of a high-aluminum composition is used, there are some cases that many dislocations may be generated in the cladding layer. In such a case where the cladding layer is composed of a superlattice structure, the dislocations are laterally bent at the interfaces in the superlattice structure, and thereby the dislocations collide with each other, resulting in disappearance thereof. Therefore, the propagation of the dislocations toward the upper direction from the layered plane is suppressed. When a superlattice structure is employed for the cladding layer in a structure in which a current-confining layer of a high-aluminum composition is used, it is possible to obtain not only an effect of reducing resistance, which is just the original function of the superlattice structure, but also the effect of suppressing dislocations.

The semiconductor laser according to the third embodiment of the present invention is a Group III nitride semiconductor laser device comprising an active layer made of a Group III nitride semiconductor, a current-confining layer provided over the active layer, an opening for current injection provided as a current injection region in the current-confining layer, a cladding layer of a superlattice structure provided on an upper part of the current-confining layer and the opening for current injection, a contact layer provided on an upper part of the cladding layer, an insulating layer having an opening provided on a surface of the contact layer, and an electrode provided in contact with the contact layer exposed in the opening, wherein the opening for current injection in the current injection region is in stripe shape, and the current-confining layer is constituted by a pair of stripe-shaped current-confining layers provided on both sides of the stripe-shaped opening for current injection.

According to the third embodiment of the present invention, it is possible to limit areas where the current-confining layer is provided to a requisite minimum, and as a result of this, it is possible to conduce to reduction in internal strains. Because a material having a composition different from those of surrounding semiconductors is used for the current-confining layer, strains and stresses due to a difference in lattice constant and the like are generated at interfaces between the current-confining layer and other semiconductor layers. In the present invention, therefore, this problem is solved by providing a pair of stripe-shaped current-confining layers on both sides of the current injection region (the stripe-shaped opening for current injection). According to this construction, the coverage ratio of the current-confining layer to the underlying layer can be reduced, and thereby strains and stresses are effectively reduced, with the result that a good current injection efficiency can be realized.

In the third embodiment of the present invention, it is preferred that each of the ends of the opening of the insulating layer be positioned over the current-confining layer. It is desired that the current-confining layer have the lowest possible coverage ratio to the underlying layer (the active layer) within the range in which the layer maintains its function of current-confining. However, the leakage of a carrier injected from the electrode becomes a problem when areas where the current-confining layer is provided are reduced. For instance, in such a case if there is provided such a construction that the current-confining layer is provided only around the current injection region (the stripe-shaped opening for current injection) and no current-confining layer is provided in the region further outward thereof, strains are reduced, but the leakage of a carrier (leakage of a current) in the region outward from the stripe-shaped current-confining layer becomes a problem. According to the third embodiment of the present invention, which has the above-described construction, attained thereby is the positional relationship such that the insulating layer is provided over the outside region where no current-confining layer is provided, and hence a construction in which current is not injected in the outside region where no current-confining layer is provided is realized. As a result of this, it is possible to suppress the generation of strains due to the presence of the current-confining layer and it is possible to realize a good current injection efficiency.

Incidentally, in the above-described third embodiment of the present invention, the coverage ratio of the current-confining layer to the underlying layer (the active layer) is preferably 50% or less, more preferably 20% or less. Such a choice enables the generation of strains by the current-confining layer to be more positively suppressed and it is possible to realize a good current injection efficiency.

EFFECT OF THE INVENTION

As described above, the semiconductor laser according to the first embodiment of the present invention has such a structure wherein a cladding layer of a superlattice structure is employed and the dislocation density of the superlattice cladding layer in a region directly above the current-confining layer is higher than the dislocation density of the superlattice cladding layer in a region directly above the opening for current injection provided in the current-confining layer. Therefore, it is possible to stably obtain a good current injection efficiency.

The semiconductor laser according to the second embodiment of the present invention uses a cladding layer of a superlattice structure in combination with a current-confining layer made of a high-Al composition $Al_xGa_yIn_{1-x-y}N$. Therefore, it is possible to stably obtain a good current injection efficiency.

Further, the semiconductor laser according to the third embodiment of the present invention has such a structure wherein an insulating layer having an opening is provided on a surface of the contact layer and, at the same time, a pair of stripe-shaped current-confining layers is provided on both sides of the current injection region (the stripe-shaped opening for current injection). Therefore, it is possible to realize a good current injection efficiency while suppressing the generation of strains due to the current-confining layer.

DESCRIPTION OF SYMBOLS

101 Ridge
102 Insulating layer
103 p type electrode
201 Current-confining layer
301 n type GaN substrate
302 Si-doped n type GaN layer
303 n type cladding layer
304 n type GaN guide layer
305 Multi-quantum well (MQW) layer
306 Cap layer
307 p type GaN guide layer
308 Current-confining layer
309 p type cladding layer
310 p type contact layer
311 p type electrode
313 Insulating layer

BEST MODE FOR CARRYING OUT THE INVENTION

The embodiments of the present invention will be explained below with reference to the drawings. In the drawings, like component members are referred by same symbol and duplicate descriptions therefor were avoided by appropriately omitting.

An example in which the present invention is applied to a semiconductor laser will be explained with reference to FIG. 3. This semiconductor laser comprises such a layered structure that, upon an n type GaN substrate 301, an Si-doped n type GaN layer 302 (Si concentration: $4\times10^{17}$ cm$^{-3}$, thickness: 1 μm), an n type cladding layer 303 made of Si-doped n type $Al_{0.1}Ga_{0.9}N$ (Si concentration: $4\times10^{17}$ cm$^{-3}$, thickness: 2 μm), an n type optical confinement layer 304 made of Si-doped n type GaN (Si concentration: $4\times10^{17}$ cm$^{-3}$, thickness: 0.1 μm), a 3-period multi-quantum well (MQW) layer 305 composed of an $In_{0.15}Ga_{0.85}N$ (thickness: 3 nm) well layer and an Si-doped $In_{0.01}Ga_{0.99}N$ (Si concentration: $1\times10^{18}$ cm$^{-3}$, thickness: 4 nm) barrier layer, a cap layer 306 made of Mg-doped p type $Al_{0.2}Ga_{0.8}N$ (Mg concentration: $2\times10^{19}$ cm$^{-3}$, thickness: 10 μm), and a p type GaN guide layer 307 made of Mg-doped p type GaN (Mg concentration: $2\times10^{19}$ cm$^{-3}$, thickness: 0.1 μm) are formed in multi-layer shape. And on top of this, there are further layered in series a current-confining layer 308, a p type cladding layer 309 of a superlattice structure (total thickness: 0.65 μm) consisting of a GaN/$Al_{0.1}Ga_{0.9}N$ (thickness: 2.5 nm/2.5 nm, Mg concentration: $1\times10^{19}$ cm$^{-3}$/$1\times10^{19}$ cm$^{-3}$) 130-period structure, and a p type contact layer 310 made of Mg-doped p type GaN (Mg concentration: $1\times10^{20}$ cm$^{-3}$, thickness: 0.02 μm). The top surface of the p type contact layer 310 is a smooth surface. A p type electrode 311 is provided on an upper part of this layered structure (on an upper part of the p type contact layer 310) and an n type electrode 312 is provided on a lower part of the n type GaN substrate 301.

The current-confining layer 308 performs the role of blocking the flow of a current in the layer thickness direction. The current-confining layer 308 may be formed from, for example, a material with higher resistance than that for the p type cladding layer 309. $Al_xGa_yIn_{1-x}N$ of high-Al composition may be employed as a high-resistance material used for the current-confining layer 308. In this case, it is preferred that x be 0.4 or higher and it is particularly preferred that AlN be used. In addition, it is preferred that the thickness of the current-confining layer 308 be selected in the range of 50 nm or thicker, but of 200 nm or thinner. By making such a choice, for example, at each interface of the p type cladding layer of a superlattice structure 309/the current-confining layer 308/ the p type GaN guide layer 307, a heterojunction having band discontinuity $\Delta E_v$ of a valance band is formed and, therefore, a certain current blocking effect is attained. Also, by using $Al_xGa_yIn_{1-x-y}N$ of high-Al composition for the current-confining layer 308, it is possible to make the refractive index of the current-confining layer 308 lower than the refractive index of the p type GaN guide layer 307 and the effective refractive index of the p type cladding layer of a superlattice structure 309. When the refractive index of an active layer is denoted by $n_1$, the refractive index of an optical guide layer is denoted by $n_2$, the refractive index of a cladding layer is denoted by $n_3$, and the refractive index of a current-confining layer is denoted by $n_4$, then it is possible to ensure that $n_1 - n_2 \geqq 0.06$, $n_2 - n_3 \geqq 0.03$, $n_3 - n_4 \geqq 0.02$ so that the condition $n_1 > n_2 > n_3 > n_4$ is satisfied. Therefore, when a comparison is made between the current injection region (the stripe-shaped opening for current injection) and the regions on both sides thereof where the current-confining layer 308 is provided, a difference in the effective refractive index $\Delta n_{\mathit{eff}}$ is formed between the two, and thereby the effect of suppressing the leakage of light into the regions where the current-confining layer 308 is provided is also obtained. In addition, silicon oxide, silicon nitride or the like that are insulating materials having lower refractive indexes than that of $Al_xGa_yIn_{1-x-y}N$ of high-Al composition may also be used as a material for the current-confining layer 308. It is also possible to choose such a construction in which the current-confining layer 308 is an opposite conduction type to the p type cladding layer 309 (the n type in this embodiment) and a pn junction is formed at the interface between the two, whereby the p type GaN guide layer 307/the current-confining layer 308/the p type cladding layer 309 become a pnp structure and block the flow of a current. When this opposite conduction type to the p type cladding layer 309 is chosen, oxygen, selenium or sulfur is advantageously used as the impurity to be introduced into the current-confining layer 308.

The p type cladding layer 309 has a superlattice structure in which GaN layers and $Al_{0.1}Ga_{0.9}N$ layers are alternately layered up. The periods for the superlattice should be at least 50 periods or more, more preferably 140 periods or more. In the present embodiment, 130 periods are chosen. By inserting a layer of a superlattice structure having the above-described periods in part of the p type cladding layer, a reduction of operating voltage becomes remarkable. In such a case, it is not always necessary that the layer of the superlattice structure be in direct contact with the p side guide layer 307 and the p contact layer 310, but insertion into the interface with the p side guide layer 307 is desirable from the standpoints of lowering of operation voltage and crack suppression. Incidentally, the thickness of the p type cladding layer including the superlattice structure should be thicker than that of the current-confining layer 308. Particularly, when a layer of a superlattice structure is inserted into the interface with the p side guide layer 307, from the standpoints of crack suppression and lowering of operation voltage, it is more preferred that the thickness of the layer of a superlattice structure that the p type cladding layer 309 has be thicker than the thickness of the current-confining layer 308.

The p type cladding layer 309 has a portion of low dislocation density and a portion of high dislocation density. That is, in a region directly above the current-confining layer 308, the dislocation density is relatively high, whereas in a region directly above the opening for current injection provided in the current-confining layer 308, the dislocation density is relatively low. In the present embodiment, the dislocation density in a region directly above the current-confining layer 308 is not less than 100 times the dislocation density in a region directly above the opening for current injection provided in the current-confining layer 308. This structure can be realized by appropriately selecting the composition and film deposition conditions of the current-confining layer 308 and the growth conditions (film deposition rate, V/III ratio, etc.) of the p type cladding layer 309.

Effects of the semiconductor laser according to this embodiment will be described below.

In the semiconductor laser according to the present embodiment, as the p type cladding layer 309 has a superlattice structure, the resistance in the layer thickness direction decreases and the carrier mobility in the in-plane direction of the layer increases. That is, because holes are induced in the GaN layer in the GaN/AlGaN superlattice structure, the electric resistance in the film thickness direction decreases, resulting in a decrease in the electric resistance when a carrier is injected from the p type electrode 311. Furthermore, in the above-described semiconductor laser, the carrier mobility in the in-plane direction of the layer increases due to the superlattice structure, and it becomes possible to efficiently concentrate a carrier that is injected from the p type electrode positioned outward from the region directly above the opening for current injection on the opening for current injection and to use the carriers in LD operation. For this reason, it becomes possible to substantially reduce the operating voltage to be applied in obtaining desired laser light output.

Furthermore, because the p type cladding layer 309 has a superlattice structure, dislocations generated at the interface between the AlN that becomes the current-confining structure 308 and the layer of the superlattice structure are laterally bent and disappear due to the reaction between the dislocations. As a result, the crystalline quality of the layer of a superlattice structure is significantly improved.

Furthermore, the dislocation density of the p type cladding layer 309 is relatively high in a region directly above the current-confining layer 308, whereas the dislocation density is relatively low in a region directly above the opening for current injection provided in the current-confining layer 308. Therefore, a high-resistance semiconductor layer is obtained in a region directly above the current-confining layer 308, and thereby a good current blocking effect is obtained. At the same time, a low-resistance semiconductor layer is obtained in a region directly above the opening for current injection, and thereby good current injection is realized.

Concretely, in the opening for current injection, the layer of the GaN/AlGaN superstructure is formed on the p type GaN guide layer 307, and dislocations generated at the interface are originally small in number. The dislocation density of the p type cladding layer 309 in a region directly above the opening for current injection is less than $10^8$ cm$^2$. On the other hand, when low-temperature grown AlN is used as the current-confining layer 308, dislocations generated at the interface with the layer of the superlattice structure are very large in number. Therefore, even though there occurs such a phenomenon that the dislocations are laterally bent in the interior of the layer of the superlattice structure and disappear due to reactions between the dislocations, in a region directly above the current-confining layer 308, the dislocation density of the p type cladding layer 309 still exceeds $10^9$ cm$^{-2}$. A low-resistance semiconductor layer is obtained if the dislocation density of the p type cladding layer 309 including the layer of the superlattice structure is less than $10^8$ cm$^{-2}$. However, a high-resistance semiconductor layer is obtained when the dislocation density exceeds $10^9$ cm$^{-2}$. That is, by appropriately selecting the composition and film deposition conditions of $Al_xGa_yIn_{1-x-y}N$ of high-Al composition, which is used in the current-confining layer 308, and the growth conditions of the p type cladding layer 309 including the layer of the GaN/AlGaN superlattice structure, it is possible to ensure such a low dislocation densities as that of $10^5$ to $10^7$ cm$^{-2}$ in a region directly above the opening for current injection, whereas high dislocation densities exceeding $10^9$ cm$^{-2}$ in a region directly above the current-confining layer 308. By using a structure that has a clear difference in dislocation density like this, also the p type cladding layer 309 itself becomes a high-resistance semiconductor layer in a region directly above the current-confining layer 308, and thereby a good current blocking effect is obtained, while it becomes a low-resistance semiconductor layer in a region directly above the opening for current injection and good current injection is realized.

The above-described embodiment is illustrative only and it will be understood by a person skilled in the art that various modifications are possible and that such modifications are also within the scope of the present invention.

For example, although the p type electrode 311 may be formed on the whole surface of the device, the electrode width may be limited by forming an insulating layer of $SiO_2$ and the like. In this case, the contact width (the electrode width) of the p type contact layer 310 and the p type electrode 311 is limited by the opening of the insulating layer and it is preferred that the ends of the opening of the insulating layer be disposed symmetrical to the opening for current injection. The above-described low voltage effect becomes remarkable by ensuring that the opening width of the insulating layer (the electrode width) be not less than 10 times the opening width of the opening for current injection. The above-described insulating layer is effective in reducing the parasitic capacitance of the device and advantageous in terms of frequency performance.

Furthermore, part of the current-confining layer 308 present on both sides of the stripe-shaped opening, which is a current path, may be removed. In an LD in which a current-confining layer is formed on the whole surface of the device, the device is split in the steps of isolation, wire bonding, solder-mounting onto a heat sink, etc. by the influence of a large strain due to the difference between the lattice constants of the substrate and the current-confining layer. By reducing the coverage ratio of the current-confining layer to the chip area (the active layer area), stresses inherent in the whole device are reduced and long-term reliability is improved. And, at the same time, resistance to stresses applied from the outside is improved. In particular, for local stresses applied during wire bonding and solder-mounting, by providing a bending pad in a dummy opening, it is possible to avoid stress concentration on the current-confining layer and to suppress damage to the device to a minimum. Incidentally, in removing part of the current-confining layer 308 on both sides of the stripe-shaped opening, it is preferred that the current-confining layer 308 be a pair of stripe-shaped current-confining layers provided on both sides of the stripe-shaped opening. In such a case, it is necessary to suppress current leakage to the outside of the stripe-shaped current-confining layer, i.e., the region where the current-confining layer has been removed and, therefore, a structure in which the electrode width is limited by forming an insulating layer is selected. That is, it is necessary to select the width of each of the stripe-shaped current-confining layer and the electrode width so that the width obtained by summing up the width of each of the stripe-shaped current-confining layer and the opening width of the opening for current injection becomes wider compared to the electrode width. In disposing the ends of the opening of the insulating layer symmetrical to the opening for current injection, the selected width of each of the stripe-shaped current-confining layer is at least not less than 0.5 time the above-described electrode width, more preferably not less than 0.7 time. Incidentally, in the above-described structure, it is possible to select the coverage ratio of the current-confining layer to the chip area (the active layer area) in the range of 50% or less, but 2.5% or more.

Although undoped AlN, (Al)GaN and the like are used as the current-confining layer 308, these may be doped with n type impurities, such as silicon and oxygen. For the current-confining layer, it is feared that during the growth of the p type cladding layer for burying, Mg, which is a p type impurity, may diffuse, resulting in an increase in leakage current. However, by doping the current-confining layer with an n type impurity, it is possible to compensate for this and to reduce leakage current. In addition, because a deletion layer due to a pn junction is formed at the interface between the current-confining layer and the p type cladding layer, more complete current confinement is attained and, for example, the threshold current for laser operation is reduced.

Further, an undoped GaN layer may be provided on the surface of the current-confining surface 308 facing the p type cladding layer. Incidentally, during the growth of the p type cladding layer for burying, Mg, which is a p type impurity, diffuses into the undoped GaN layer provided on the surface of the current-confining layer 308, and the portion in contact with the p type cladding layer is converted into GaN that exhibits p type electrical conductivity. On the other hand, the diffusion of the p type impurity that goes beyond this undoped GaN layer and reaches the current-confining layer 308 is effectively suppressed. The thickness of the undoped GaN layer performing the above-described function may be about $\frac{1}{10}$ to about $\frac{1}{2}$ of the thickness of the current-confining layer 308. However, the total of the thickness of the undoped GaN layer and the current-confining layer 308 should be selected so as to be thinner than that of the p type cladding layer. Furthermore, by providing an undoped GaN layer, which is formed beforehand by high-temperature growth, on the surface of the current-confining layer 308 in which low-temperature grown undoped AlN, (Al)GaN and the like are used, it is ensured that the growth of the p type cladding layer for burying become easy.

In addition, also insulating materials, such as silicon oxide and silicon nitride, may be used as constituent materials for the current-confining layer 308. Although more complete current confinement is possible when these insulating materials are used, during the growth of the p type cladding layer for burying, polycrystalline growth occurs on the current-confining layer 308 made of an insulating material and a surface that is smooth on the whole surface of the device is not obtained. However, the p type cladding layer that grows on the stripe-shaped surface of the opening undergoes lateral growth when it reaches the surface of the current-confining layer 308 made of an insulating material. Incidentally, when this lateral growth is utilized, it is preferred that the thickness of the current-confining layer 308 made of an insulating material be selected in the range of 50 nm or thicker, but 100 nm or thinner. A smooth portion wider than the opening for current injection is obtained by the lateral growth of the p type cladding layer from this stripe-shaped opening to the surface of the current-confining layer 308 made of an insulating material. By forming a p contact layer and a p type electrode in this smooth portion, it is possible to obtain an effect of lowering voltage similar to that of a smooth structure obtained when the current-confining layer 308 made of undoped AlN, (Al)GaN and the like that is low-temperature grown is used.

The doping of the p type cladding layer 309 with a p type impurity may be performed for both or either of the AlGaN layer and GaN layer that compose the superlattice structure. In order to reduce resistance in the in-plane direction of the layer, it is desirable to use a modulation doped superlattice structure that is obtained by doping only the AlGaN layer with Mg in the GaN/AlGaN superlattice structure. This modulation doped superlattice structure that is obtained by doping only the AlGaN layer with Mg is effective in improving the flatness during the growth for burying.

EXAMPLES

Example 1

Figure 3:
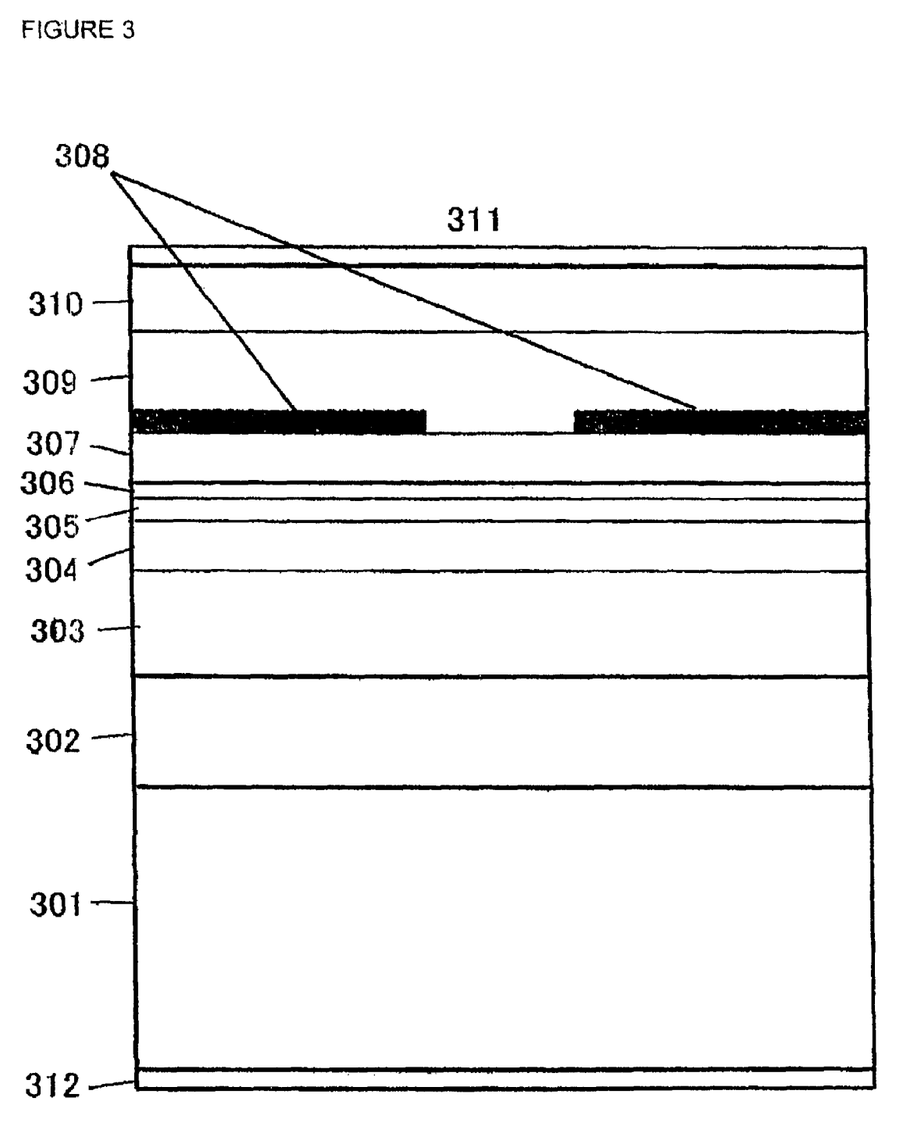
FIG. 3 is a sectional view that schematically shows the structure of an inner stripe type semiconductor laser according to the first embodiment of the present invention.

The LD of the present example has a basic structure similar to that shown in the first embodiment (FIG. 3). A manufacturing method of this LD will be described below.

An n type GaN (0001) substrate was used as the substrate. An MOVPE apparatus is used in fabricating the device structure. A mixed gas of hydrogen and nitrogen is used as the carrier gas, trimethyl gallium (TMG), trimethyl aluminum (TMA) and trimethyl indium (TMI) are used as Ga, Al and IN sources, respectively, silane ($SiH_4$) is used as an n type dopant, and bis-cyclopentadienyl magnesium ($Cp_2Mg$) is used as a p type dopant.

First, growth for an n type cladding layer 303, a n type optical confinement layer 304, a multiquantum well (MQW) layer 305 for an active layer, a cap layer 306, and a p type optical confinement layer (guide layer) 307 are conducted, and followed by the growth of a low-temperature grown AlN layer for a current-confining layer 308. This step is hereinafter called "the active layer growth step."

After loading an n type GaN substrate 301 into the growth apparatus, the substrate is heated up while $NH_3$ is being supplied, and growth is started at the instant that its temperature reaches a growth temperature. An Si-doped n type GaN layer 302 (Si concentration: $4\times10^{17}$ $cm^{-3}$, thickness: 1 μm), an n type cladding layer 303 made of Si-doped n type $Al_{0.1}Ga_{0.9}N$ (Si concentration: $4\times10^{17}$ $cm^{-3}$, thickness: 2 μm), an n type optical confinement layer 304 made of Si-doped n type GaN (Si concentration: $4\times10^{17}$ $cm^{-3}$, thickness: 0.1 μm), a 3-period multiquantum well (MQW) layer 305 composed of an $In_{0.15}Ga_{0.85}N$ (thickness: 3 nm) well layer and an Si-doped $In_{0.01}Ga_{0.99}N$ (Si concentration: $1\times10^{18}$ $cm^{-3}$, thickness: 4 nm) barrier layer, a cap layer 306 made of Mg-doped p type $Al_{0.2}Ga_{0.6}N$ (Mg concentration: $2\times10^{19}$ $cm^{-3}$, thickness: 50 nm), and a p type optical confinement layer (guide layer) 307 made of Mg-doped p type GaN(Mg concentration: $2\times10^{19}$ $cm^{-3}$, thickness: 0.1 μm) are sequentially deposited. The GaN growth is carried out rising such a condition as a substrate temperature of 1080° C., a TMG supply rate of 58 μmol/min and an $NH_3$ supply rate of 0.36 mol/min, and the AlGaN growth is carried out using such a condition as a substrate temperature of 1080° C., a TMA supply rate of 36 μmol/min, a TMG supply rate of 58 μmol/min and an $NH_3$ supply rate of 0.36 mol/min. The InGaN MQW growth is performed by using such a condition as at substrate temperature of 800° C., at a TMG supply rate of 8 μmol/min and an $NH_3$ supply rate of 0.36 mol/min, the TMIn supply rate being 48 μmol/min for a well layer and 3 μmol/min for a barrier layer. After the deposition of these structures, the substrate temperature is lowered to 400° C. and deposition of a low-temperature grown AlN layer (thickness: 100 nm, later this layer becomes the current-confining layer 308) is performed.

Next, a stripe-shaped opening is formed in the low-temperature grown AlN layer. This step is hereinafter called "the stripe forming step." $SiO_2$ film is deposited in a thickness of 100 nm on the AlN layer, a resist is applied to the surface, and after that, a stripe pattern having a width of 2 μm is formed by photolithography. Next, the $SiO_2$ film is etched with buffered hydrofluoric acid by using a resist as a mask, the resist is then removed with an organic solvent, and water washing is performed. Next, the selective etching of the low-temperature grown AlN layer is performed by using the $SiO_2$ film as a mask. A solution obtained by mixing phosphoric acid and sulfuric acid in proportions of a volume ratio of 1:1 is used as a selective etching liquid therefor. The AlN layer in the region not covered with the $SiO_2$ mask is removed by etching in the above-described solution held at 80° C. for 10 minutes to produce the stripe-shaped opening therein. Furthermore, the $SiO_2$ film used as the mask is removed with buffered hydrofluoric acid and a structure having a stripe-shaped opening with a width of 2 μm in the AlN layer is obtained.

The sample having a stripe-shaped opening thus obtained is subjected to the re-growth of a cladding layer of a GaN/Mg-doped AlGaN superlattice structure to burry thereover. This step is hereinafter called "the p cladding layer re-growth step." After loading the sample into the MOVPE apparatus, the simple is heated up to 950° C., which is a growth temperature, at an $NH_3$ supply rate of 0.36 mol/min. After the temperature of 950° C. is reached, a p type cladding layer 309 of a superlattice structure which is composed of a GaN layer (thickness: 2.5 nm) and an Mg-doped $Al_{0.1}Ga_{0.9}N$ layer (Mg concentration: $1\times10^{19}$ $cm^{-3}$, thickness: 2.5 nm) grown in 140 periods is deposited, and then a contact layer 310 made of Mg-doped p type GaN (Mg concentration: $1\times10^{20}$ $cm^{-3}$, thickness: 0.02 μm) is deposited thereon.

As a result of the foregoing steps, there is obtained an LD wafer comprising the n type cladding layer 303, the n type optical confinement layer 304, the multi-quantum well (MQW) layer 305 for an active layer, the cap layer 306, a p type optical confinement layer (guide layer) 307, the current-confining layer 308, the p type cladding layer 309 and the p type contact layer 310. A p type electrode 311 and an n type electrode 312 are formed for this LD wafer. This step is hereinafter called "the electrode step."

Upon the back side of the n type GaN substrate 301 there are vacuum evaporated Ti in a thickness of 5 nm and Al in a thickness of 20 nm in this order, and subsequently upon the p type contact layer 310 there are vacuum evaporated Ni in a thickness of 10 nm and Au in a thickness of 10 nm in this order. The above-described sample is loaded into an RTA apparatus and alloying is performed at 600° C. for 30 seconds to form ohmic contacts therewith. Au is vacuum evaporated upon the TiAl film on the back side of the substrate and the NiAu film on the front side to provide the n type electrode 312 and the p type electrode 311 thereof, respectively.

The wafer on which the n type electrode and the p type electrode are formed as described above is cleaved in bar shape along to a direction perpendicular to the stripe-shaped opening for current injection provided in the current-confining layer, and thereby a resonator perpendicular to the cleavage plane is fabricated. A dielectric multilayer film composed of $TiO_2$ and $Al_2O_3$ is formed on end surfaces of the resonator so that the reflectance on the front side $R_f$ is set at 5% and the reflectance on the back side $R_b$ is set at 90%, respectively. Lastly, the bar is cut in a direction perpendicular to the cleavage plane, whereby a laser device as shown in FIG. 3 is obtained. Incidentally, the resonator length of 600 μm and the device width of 400 μm are selected therefor.

A section of the obtained LD chip was observed under a transmission electron microscope. The dislocation density ($8\times10^{10}$ $cm^{-2}$) of the p type cladding layer of a superlattice structure in a region directly above the current-confining layer was not less than 100 times the dislocation density ($6\times10^7$ $cm^{-2}$) of the p type cladding layer in a region directly above the above-described stripe-shaped opening for current injection.

The LD chip obtained by the above-described steps was solder-mounted onto a heat sink in P-side up arrangement, and each electrode was wire bonded. The light emission performance of the LD chip was tested and its laser operation was confirmed at a heat sink temperature of 25° C. and under threshold conditions in pulse oscillation (frequency: 10 MHz, duty ratio: 50%) such that a threshold current density is 2.8 kA/cm$^2$ in terms of a value (I/S) given by dividing the current I by the area S of the stripe-shaped opening for current injection (2 μm (W)×600 μm (L)) at a voltage of 4.0 V applied to the device.

In the present example, after all the device except the stripe-shaped opening for current injection, which becomes a current path, is covered with a low temperature grown AlN layer, re-growth is carried out thereon to bury the opening with the p type cladding layer which is all consisting of a GaN/Mg-doped AlGaN superlattice structure.

The obtained semiconductor laser was excellent in the current injection efficiency, showed low-voltage operation, and was free from possible damage induced by wire bonding or the like. In addition, flat growth to bury with a p type cladding layer of a superlattice structure was possible in the whole wafer, and it was possible to stably obtain an LD device that operates at a low voltage in the whole wafer.

Example 2

Figure 4:
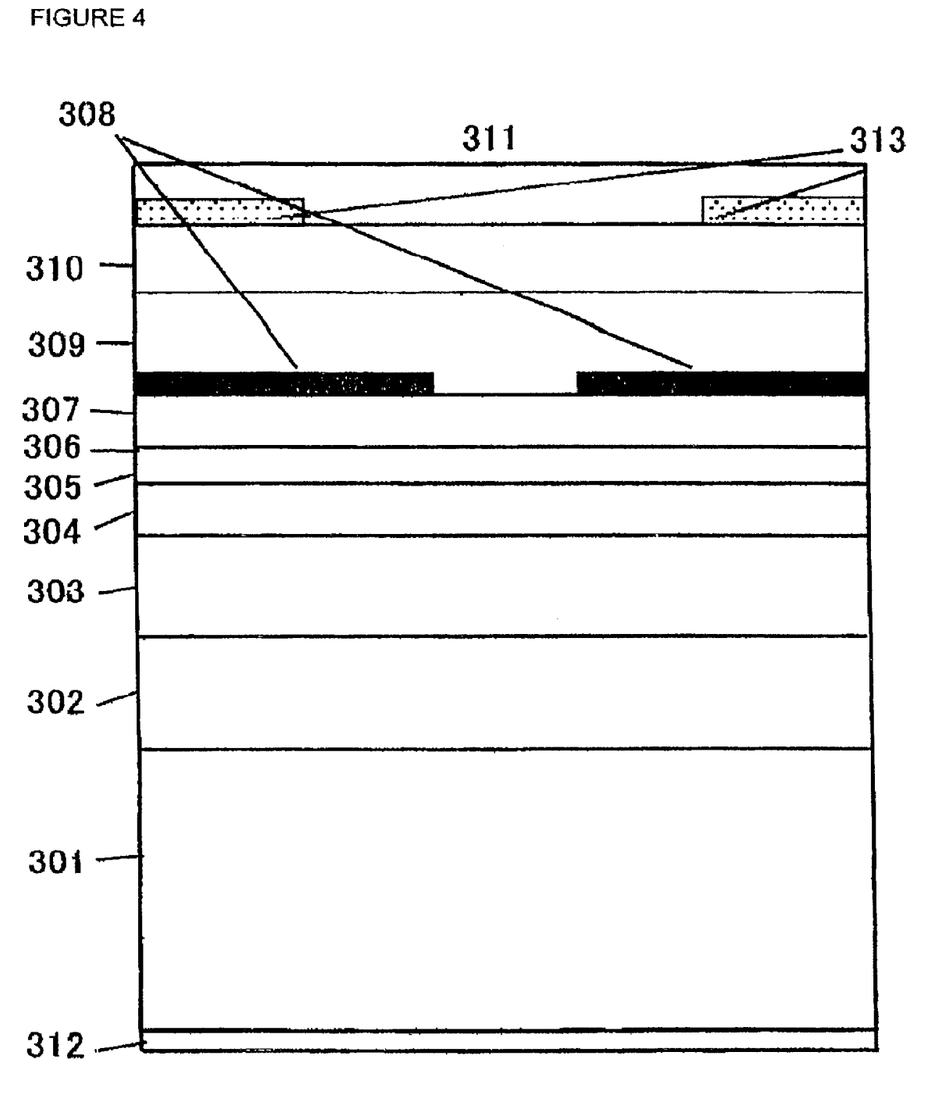
FIG. 4 is a sectional view that schematically shows the structure of an inner stripe type semiconductor laser according to the second embodiment of the present invention.

The schematic construction of the LD of the present example is shown in FIG. 4. In this semiconductor laser device, the area of contact of a p type electrode 311 with a p type GaN contact layer 310 is limited by an insulating layer 313 and hence this semiconductor laser device differs from the device of Example 1 in this respect. A manufacturing process of this semiconductor laser device will be described below.

First, after the passage through "the activated layer growth step," "the stripe forming step," and "the p cladding layer re-growth step" in a similar manner to those in the first example, there is obtained an LD wafer comprising an n type cladding layer 303, an n type guide layer 304, an active layer 305 and a cap layer 306, a p type guide layer 307,a current-confining layer 308, a p type cladding layer 309 and a p type contact layer 310. After that, upon the p type contact layer 310, an SiO$_2$ film of 7000 angstroms is deposited as an insulating film 313 by the CVD method, and a stripe-shaped opening having a width of 20 μm is formed by photolithography directly above a stripe-shaped opening for current injection provided in the current-confining layer. After that, it is subjected to "the electrode step" in a similar way to that in Example 1 to form the p type electrode 311 and the n type electrode 312 thereon.

A wafer obtained by the above-described steps is cleaved in bar shape along to a direction perpendicular to the stripe-shaped opening for current injection provided in the current-confining layer, and thereby a resonator perpendicular to the cleavage plane is fabricated. A dielectric multilayer film composed of TiO$_2$ and Al$_2$O$_3$ is formed on end surfaces of the resonator so that the reflectance on the front side R$_f$ is set at 5%, and the reflectance on the back side R$_b$ is set at 90%, respectively. Lastly the bar is cut in a direction perpendicular to the cleavage plane, whereby a laser device as shown in FIG. 4 is obtained. Incidentally, the resonator length of 600 μm and the device width of 400 μm are selected therefor.

A section of the obtained LD chip was observed under a transmission electron microscope. The dislocation density ($10^9$ to $10^{11}$ cm$^{-2}$) of the p type cladding layer of a superlattice structure in a region directly above the current-confining layer was not less than 100 times the dislocation density ($10^5$ to $10^{-7}$ cm$^{-2}$) of the p type cladding layer in a region directly above the above-described stripe-shaped opening for current injection.

The LD chip obtained by the above-described steps was solder-mounted onto a heat sink in P-side up arrangement, and each electrode was wire bonded. The light emission performance of the LD chip was tested and its laser operation was confirmed at a heat sink temperature of 26° C. and under threshold conditions in pulse oscillation (frequency: 10 MHz, duty ratio: 50%) such that a threshold current density is 2.8 kA/cm$^2$ in terms of a value (I/S) given by dividing the current I by the area S of the stripe-shaped opening for current injection (2 μm (W)×600 μm (L)) at a voltage of 4.0 V applied to the device.

Incidentally, when the width of the stripe-shaped opening of the SiO$_2$ film was changed to 2, 5, 10, 50 or 100 μm in addition to the above-described 20 μm, it was ascertained that the threshold voltage for the laser operation of the device decreases, in dependence on the width of the opening, with increasing width. However, it was also ascertained that this decreasing effect becomes saturated when the opening width becomes 20 μm or wider.

On the other hand, it is ascertained that when the width of the stripe-shaped opening of the SiO$_2$ film is changed to 2, 5, 10, 50 or 100 μm, the capacitance of the whole laser device measured when the device is biased at a voltage of 4V increases from 15 pF to 30 pF with increasing width. Incidentally, in the aforementioned laser device of Example 1, the capacitance of the whole laser device measured when the device is biased at a voltage of 4V is 50 pF.

In the present example, the surface of the p type contact layer 310 is coated with an SiO$_2$ film of a thickness of not less than 5000 angstroms having an opening 20 μm in width, and the insulating layer 313 is provided in 90% or more of the device area (device width: 400 μm). The width of the contact area of the p type electrode to the p type contact layer 310 is limited to about 10 times the width of the opening for current injection provided in the current-confining layer. The obtained semiconductor laser was excellent in the current injection efficiency and showed low capacitance and low-voltage operation, and was free from possible damage induced by wire bonding or the like. In addition, flat growth to bury with a p type cladding layer of a superlattice structure was possible in the whole wafer, and it was possible to stably obtain an LD device that operates at a low voltage with a high device yield in the whole wafer.

Example 3

Figure 5:
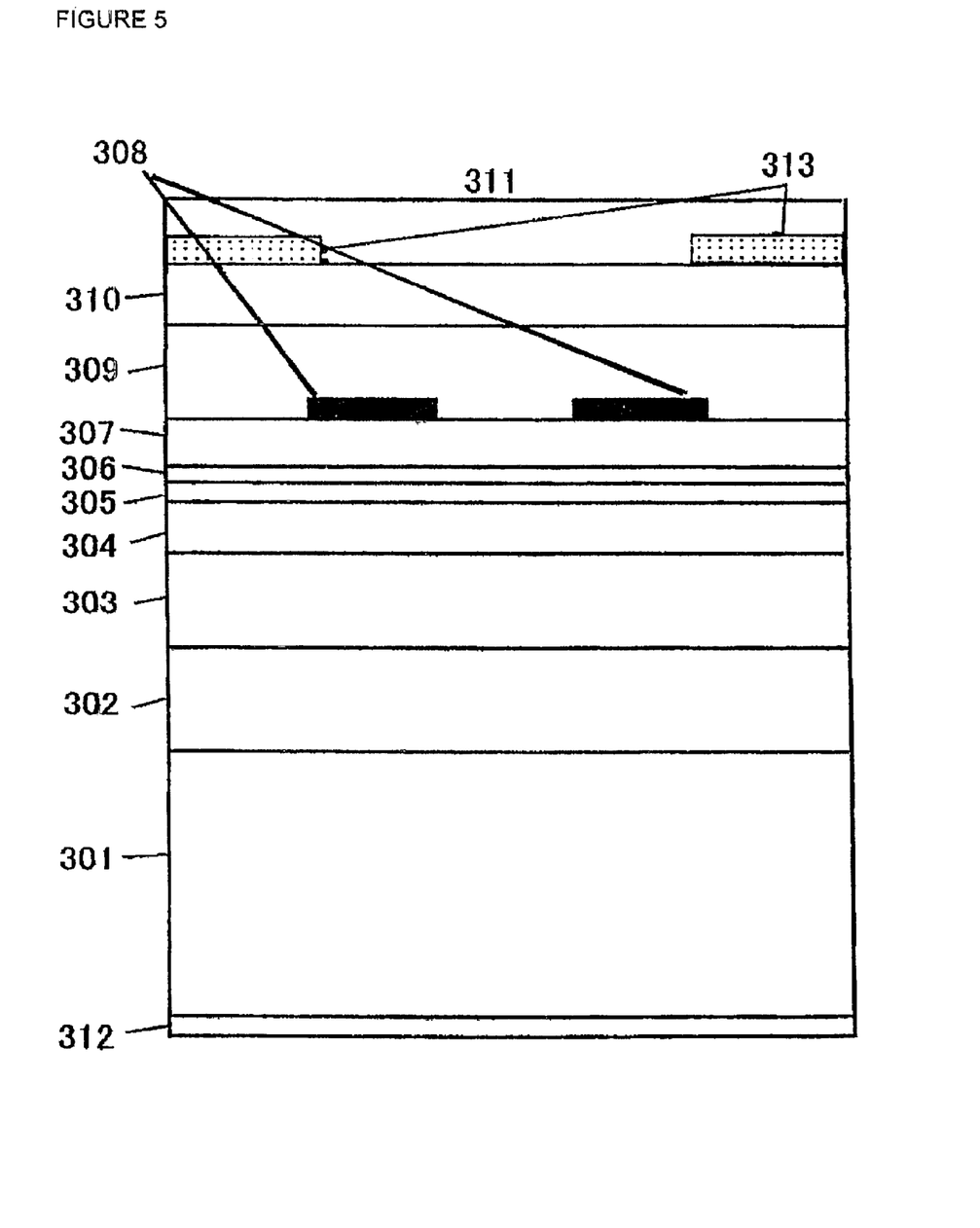
FIG. 5 is a sectional view that schematically shows the structure of an inner stripe type semiconductor laser according to the third embodiment of the present invention.

The schematic construction of the LD of the present example is shown in FIG. 5. This semiconductor laser device differs from the devices of Examples 1 and 2 in that part of a current-confining layer 308 is removed in the regions on both sides of a stripe-shaped opening, which becomes a current path. A manufacturing process of the device will be described below.

First, after the passage through "the active layer growth step" in a similar manner to that in the first example, a structure having a stripe-shaped AlN layer 20 μm in width on both sides of a stripe-shaped opening 2 μm in width, which becomes a current path, is obtained by the method described as for "the stripe forming step." The coverage ratio of the current-confining layer (low-temperature grown AlN layer) to the underlying layer (the p type GaN guide layer/the active layer), i.e., the ratio of the area of the current-confining layer 308 constituted by two stripe-shaped AlN layers having a width of 20 μm to the whole area of the p type GaN guide layer 307 having a width of 400 μm is about 20%.

After the passage through "the p cladding layer re-growth step" in a similar manner to that in the first example, there is then obtained an LD wafer comprising an n type cladding layer 303, an n type guide layer 304, an active layer 305 and a cap layer 306, a p type guide layer 307, a current-confining layer 308, a p type cladding layer 309 and a p type contact layer 310. After that, upon the p type contact layer 310, an SiO$_2$ film 7000 angstroms in film thickness is deposited as an insulating layer 313 by the CVD method, and thereafter a stripe-shaped opening having a width of 20 μm is formed by photolithography. The stripe-shaped opening is formed so as to be positioned directly above an opening for current injection provided in the current-confining layer. After that, it is subjected to "the electrode step" in a similar way to that in Example 1 to form the p type electrode 311 and the n type electrode 312 thereon.

A wafer obtained by the above-described steps is cleaved in bar shape along to a direction perpendicular to the stripe-shaped opening for current injection provided in the current-confining layer, and thereby a resonator perpendicular to the cleavage plane is fabricated. A dielectric multilayer film composed of TiO$_2$ and Al$_2$O$_3$ is formed on end surfaces of the resonator so that the reflectance on the front side $R_f$ is set at 5%, and the reflectance on the back side $R_b$ is set at 90%, respectively. Lastly the bar is cut in a direction perpendicular to the cleavage plane, whereby a laser device as shown in FIG. 5 is obtained. Incidentally, the resonator length of 600 μm and the device width of 400 μm are selected therefor.

A section of the obtained LD chip was observed under a transmission electron microscope. The dislocation density ($10^9$ to $10^{11}$ cm$^{-2}$) of the p type cladding layer of a superlattice structure in a region directly above the current-confining layer was not less than 100 times the dislocation density ($10^5$ to $10^{-7}$ cm$^{-2}$) of the cladding layer in a region directly above the above-described stripe-shaped opening for current injection.

The LD chip obtained by the above-described steps was solder-mounted onto a heat sink in P-side up arrangement, and each electrode was wire bonded. The light emission performance of the LD chip was tested and its laser operation was confirmed at a heat sink temperature of 25° C. and under threshold conditions in pulse oscillation (frequency: 10 MHz, duty ratio: 50%) such that a threshold current density is 2.8 kA/cm$^2$ in terms of a value (I/S) given by dividing the current I by the area S of the stripe-shaped opening for current injection (2 μm (W)×600 μm (L)) at a voltage of 4.0 V applied to the device.

Incidentally, it was ascertained that device reliability is significantly improved by providing the position of the above-described wire bonding in the region from which is removed the current-confining layer of low-temperature grown AlN, which is provided on both sides of the stripe-shaped opening for current injection 2 μm in width, which becomes a current path.

In the present example, for the current-confining layer provided on both sides of the stripe-shaped opening for current injection, which becomes a current path, part of the current-confining layer is removed in regions at a distance from the opening for current injection, whereby the coverage ratio of the current-confining layer 308 to the chip area (the active layer area) is reduced and after that, re-growth is carried out thereon to bury the opening with the p type cladding layer 309 which is all consisting of a GaN/Mg-doped AlGaN superlattice structure. The obtained semiconductor laser was excellent in the current injection efficiency, and was free from possible damage induced by wire bonding or the like. In addition, flat growth to bury with a p type cladding layer of a superlattice structure was possible in the whole wafer, and it was possible to stably obtain an LD device that operates at a low voltage and has an improved long-term reliability with a high device yield in the whole wafer.

Example 4

A semiconductor laser was fabricated by the quite similar way to that of Example 3, with the exception that a current-confining layer 308 was made of an oxygen-doped GaN layer.

Incidentally, in the semiconductor laser of Example 4 in which an oxygen-doped GaN layer is used, the capacitance of the whole laser device measured when the device is biased at a voltage of 4V is 30 pF. On the other hand, in the laser device of Example 3 in which a low-temperature grown AlN layer is used, the capacitance of the whole laser device measured when the device is biased at a voltage of 4V is 20 pF.

The obtained semiconductor laser was excellent in the current injection efficiency and showed low capacitance and low-voltage operation, and was free from possible damage induced by wire bonding or the like. In addition, flat growth to bury with a p type cladding layer of a superlattice structure was possible in the whole wafer, and it was possible to stably obtain an LD device that operates at a low voltage and has an improved long-term reliability with a high device yield in the whole wafer.

Comparative Example 1

A semiconductor laser was fabricated by the quite similar way to that of Example 1, with the exception that a high-temperature grown GaN layer was used as a current-confining layer 308, and the semiconductor laser was evaluated. Incidentally, for the growth of the high-temperature grown GaN layer, the fabrication conditions for a GaN film showing n type electrical conductivity with a resistivity of 0.5 Ω·cm were used.

After the formation of layers up to a p type optical confinement layer 307 in the similar way to that in Example 1, subsequently the substrate temperature was held at 1080° C. and a current-confining layer made of GaN was grown at this temperature. The layer thickness of the current-confining layer was set at the thickness of about 50 nm. Next to that, the GaN current-confining layer was selectively etched to provide a stripe-shaped opening having a width of 2 μm.

The steps from "the p cladding layer re-growth step" onward were carried out for the sample having a stripe-shaped opening obtained therethrough, whereby a semiconductor laser was obtained. The section structure of the obtained LD chip was observed under a transmission electron microscope. The dislocation density in the p type cladding layer of a superlattice structure was almost uniform, and it was ascertained that no variation of the number of dislocations had occurred between the dislocation density ($10^5$ to $10^7$ cm$^{-2}$) on an upper part of the current-confining layer and the dislocation density ($10^5$ to $10^7$ cm$^{-2}$) on an upper part of the opening provided in the current-confine layer (the region for current injection). When SIMS measurement was made, in the high-temperature grown GaN current-confining layer, high-concentration Mg (Mg concentration: $8 \times 10^{18}$ cm$^{-3}$), which was considered to have diffused during the re-growth of the p type cladding layer, was detected. Therefore, owing to the diffused Mg, the remaining portion showing n type electric conductivity corresponds to a thickness of 30 nm in the high-temperature grown GaN current-confining layer having a thickness of 50 nm. In such a structure, a carrier injected from a p type electrode spreads to the whole p type cladding layer, and the current confining effect of the current-confining layer itself also decreases, with the result that leakage current increases. The obtained LD chip was was solder-mounted onto a heat sink in P-side up arrangement, and each electrode was wire bonded. The light emission performance of the LD chip was tested and its laser operation was confirmed at a heat sink temperature of 25° C. and under threshold conditions in pulse oscillation (frequency: 10 MHz, duty ratio: 50%) such that a threshold current density is 6 kA/cm² in terms of a value (I/S) given by dividing the current I by the area S of the stripe-shaped opening for current injection (2 μm (W)×600 μm (L)) at a voltage of 4.0 V applied to the device.

Incidentally, in the semiconductor laser of Comparative Example 1 in which a high-temperature grown GaN layer is used as the current-confining layer 308, the slope efficiency in the vicinity of an injected current I=60 mA is 1.2 W/A. On the other hand, in the semiconductor laser of Example 1 in which a low-temperature grown AlN layer is used as the current-confining layer 308, the slope efficiency in the vicinity of an injected current I=60 mA is 1.5 W/A.

The invention claimed is:

1. A Group III nitride semiconductor optical device comprising:
    an active layer made of a Group III nitride semiconductor;
    a current-confining layer provided over the active layer;
    an opening for current injection provided as a current injection region in the current-confining layer;
    a cladding layer of a superlattice structure provided on an upper part of the current-confining layer and the opening for current injection;
    a contact layer provided on an upper part of the cladding layer; and
    an electrode provided on a surface of the contact layer,
    wherein the dislocation density of the cladding layer in a region directly above the current-confining layer is higher than the dislocation density of the cladding layer in a region directly above the opening for current injection,
    wherein the current-confining layer is made of $Al_xGa_yIn_{1-x-y}N$ ($0.4 \leq x \leq 1$, $0 \leq y \leq 0.6$, $0 \leq x+y \leq 1$),
    wherein the thickness of the current-confining layer is selected in the range of 50 nm or thicker, but 200 nm or thinner,
    wherein the Group III nitride semiconductor optical device further comprises an insulating layer having an opening that is provided on the surface of the contact layer,
    wherein the electrode is provided so as to be in contact with the contact layer exposed in the opening,
    wherein the opening for current injection of the current injection region is in stripe shape,
    wherein the current-confining layer is constituted by a pair of stripe-shaped current-confining layers provided on both sides of the stripe-shaped opening for current injection, and
    wherein each of ends of the opening provided in the insulating layer is positioned over the current-confining layers.

2. A Group III nitride semiconductor optical device as claimed in claim 1,
    wherein the insulating layer is a silicon oxide film or a silicon nitride film.

3. A Group III nitride semiconductor optical device as claimed in claim 1,
    wherein the total width that is obtained by summing up the width of each of the stripe-shaped current-confining layer and the opening width of the opening for current injection is wider than the electrode width.

4. A Group III nitride semiconductor optical device as claimed in claim 3,
    wherein the coverage ratio of the current-confining layer to the active layer is 50% or less, but 2.5% or more.

5. A Group III nitride semiconductor optical device as claimed in claim 4,
    wherein the ends of the opening of the insulating layer are positioned symmetrically to the opening for current injection, and
    the width of each of the stripe-shaped current-confirming layers is not less than 0.7 times the electrode width.

6. A Group III nitride semiconductor optical device comprising:
    an active layer made of a Group III nitride semiconductor;
    a current-confining layer provided over the active layer;
    an opening for current injection provided as a current injection region in the current-confining layer;
    a cladding layer of a superlattice structure provided on an upper part of the current-confining layer and the opening for current injection;
    a contact layer provided on an upper part of the cladding layer; and
    an electrode provided on a surface of the contact layer,
    wherein the dislocation density of the cladding layer in a region directly above the current-confining layer is higher than the dislocation density of the cladding layer in a region directly above the opening for current injection,
    wherein the current-confining layer is made of $Al_xGa_yIn_{1-x-y}N$ ($0.4 \leq x \leq 1$, $0 \leq y \leq 0.6$, $0 \leq x+y \leq 1$),
    wherein the thickness of the current-confining layer is selected in the range of 50 nm or thicker, but 200 nm or thinner,
    wherein the current-confining layer is made of a low-temperature grown $Al_xGa_yIn_{1-x-y}N$ ($0.4 \leq x \leq 1$, $0 \leq y \leq 0.6$, $0 \leq x+y \leq 1$),
    wherein the cladding layer has p type electrical conductivity, and
    wherein an undoped GaN layer is provided on the surface of the current-confining layer.

7. A Group III nitride semiconductor optical device as claimed in claim 6,
    wherein the undoped GaN layer is made of a high-temperature-grown GaN.

* * * * *